United States Patent [19]

Ganthier et al.

[11] Patent Number: 5,319,523
[45] Date of Patent: Jun. 7, 1994

[54] CARD EDGE INTERCONNECT APPARATUS FOR PRINTED CIRCUIT BOARDS

[75] Inventors: James J. Ganthier, Spring; John A. Landry, Tomball, both of Tex.

[73] Assignee: Compaq Computer Corporation, Houston, Tex.

[21] Appl. No.: 139,288

[22] Filed: Oct. 20, 1993

[51] Int. Cl.⁵ ............................................. H05K 9/00
[52] U.S. Cl. ................................... 361/753; 361/792; 361/794; 439/108; 439/109; 439/59
[58] Field of Search ............... 361/220, 753, 788, 791, 361/794, 816, 818; 439/92-96, 59-62, 99, 101, 108, 109, 119; 174/35 R, 35 C, 35 TS, 51

[56] References Cited

U.S. PATENT DOCUMENTS

| | | | |
|---|---|---|---|
| 3,432,795 | 3/1969 | Jayne | 439/60 |
| 3,973,817 | 8/1976 | Stalley et al. | 439/60 |
| 4,849,944 | 7/1989 | Matsushita | 439/60 |
| 5,041,945 | 8/1991 | Suzuki | 361/753 |
| 5,277,611 | 1/1994 | Berek et al. | 439/59 |

FOREIGN PATENT DOCUMENTS

| | | | |
|---|---|---|---|
| 0405398 | 1/1991 | European Pat. Off. | 361/818 |
| 3-29399 | 2/1991 | Japan | 361/818 |

*Primary Examiner*—Leo P. Picard
*Assistant Examiner*—Donald A. Sparks
*Attorney, Agent, or Firm*—Konneker Bush Hitt & Chwang

[57] ABSTRACT

The main system printed circuit board of a computer is mounted on a tray structure that also supports other CPU components of the computer and is removably insertable into the housing portion of the computer. A specially designed card edge connector portion of the system board is operatively insertable into a socketed connector on another circuit board interiorly mounted within the housing. Electrically conductive signal fingers and grounding fingers are respectively mounted on first and second sides of the card edge, with the signal fingers being connected to the signal plane of the system board, and the grounding fingers being connected to its ground plane. A sacrificial grounding pad is positioned on the second side of the edge connector portion, between the grounding pads and its leading edge, and is initially engaged by the internal connector contact strips, as the card edge is being inserted into the connector, to equalize any voltage potential between the two circuit boards before the contact strips engage the signal and grounding fingers The grounding pad thus eliminates the necessity of incorporating clamping diodes in the system board circuitry to avoid ESD damage to its components. The initially engageable grounding pad also serves as a sacrificial contact wear member that lengthens the connectivity life of the system board by diminishing the mechanical wear-away of the signal and grounding fingers.

10 Claims, 1 Drawing Sheet

CARD EDGE INTERCONNECT APPARATUS FOR PRINTED CIRCUIT BOARDS

BACKGROUND OF THE INVENTION

1. Field of the Invention

This invention generally relates to printed circuit board apparatus, and more particularly relates to card edge interconnect apparatus for printed circuit boards such as those used in computers.

2. Description of Related Art

In the printed circuit board art it is often necessary to operatively connect the circuitry on a first circuit board to the circuitry on a second board which will be oriented perpendicularly to the first circuit board This connection is conventionally made by forming electrically conductive fingers on a side surface of an edge portion of the first circuit board which is insertable into a socketed connector secured to a side of the second circuit board and having resiliently deflectable metal contact strips therein which are positioned and configured to engage the fingers to thereby electrically couple the circuitry of the first and second circuit boards.

Two problems potentially arise using this conventional "card edge" interconnection technique. First, due to the fact that the electrically conductive fingers of the first circuit board are subjected to forcible sliding contact with the resilient connector strips each time the connector edge portion of the board is inserted into or removed from the connector, mechanical finger "wear-away" occurs when the first circuit board is frequently coupled to and uncoupled from the second circuit board in this manner. At some point this mechanical wear-away will be sufficient to preclude the operative electrical interconnection of the two circuit boards.

Second, if the two circuit boards to be interconnected are at different voltage potentials their interconnection may cause an electrostatic discharge (ESD) from one board to the other board and damage one or more ESD-sensitive circuitry components on either or both of the boards A conventional method of protecting these ESD-sensitive circuitry components from such damage is to install clamping diode structures in the electrically conductive surface trace lined between the fingers and their associated components. Examples of such clamping diode structures, which function to limit the voltages transmitted to their associated circuitry components, include MOV's (metal oxide varistors), transorbs, transguards and back-to-back zener diodes.

While this approach typically provides satisfactory ESD protection to board circuitry components, it has the dual disadvantages of materially adding to the fabrication cost of the circuit board and occupying an appreciable amount of space thereon which would otherwise be available for additional operative circuitry components.

It can readily be seen from the foregoing that a clear need exists for improved card edge interconnect apparatus that eliminates or at least substantially reduces the above-mentioned problems, limitations and disadvantages commonly associated with conventional card edge interconnect apparatus. It is accordingly an object of the present invention to provide such improved card edge interconnect apparatus.

SUMMARY OF THE INVENTION

In carrying out principles of the present invention, in accordance with a preferred embodiment thereof, card edge interconnect apparatus is provided for removably and operatively coupling the circuitry of first and second circuit boards The interconnect apparatus includes a socketed connector secured to a side of the first printed circuit board and operatively coupled to its circuitry, and a specially designed edge portion of the second printed circuit board removably insertable into the connector.

Representatively, the first printed circuit board is interiorly mounted on a wall of a computer housing, and the second printed circuit board is the main system circuit board of the computer and is mounted on a support tray structure together with other CPU components of the computer such as its disc drives In response to insertion of the support tray structure into the computer housing toward the back plane circuit board, the connector edge portion of the main system board is removably inserted into the connector socket.

The connector edge portion of the second circuit board has a leading edge and first and second opposite sides. A spaced series of electrically conductive signal finger means are disposed on the first side and are coupled to the circuitry of the second circuit board and its signal plane structure. The signal finger means are spaced inwardly apart from the leading edge and are positioned to be resiliently engaged by the first connector contact strips when the connector edge portion of the second circuit board is inserted into the socketed connector on the first circuit board.

A spaced series of electrically conductive grounding finger means are disposed on the second side of the connector edge portion and are operatively coupled to the ground plane structure of the second circuit board. The grounding finger means are spaced inwardly apart from the leading edge, preferably a distance less than the distance that the signal finger means are inwardly offset from the leading edge, and are positioned to be resiliently engaged by the second connector contact strips when the connector edge portion is inserted into the connector.

Electrically conductive sacrificial grounding means are disposed on the second side of the connector edge portion and are coupled to the ground plane structure of the second printed circuit board. These sacrificial grounding means are positioned to be resiliently engaged by the second connector contact strips, as the connector edge portion is being inserted into the connector, before the signal and grounding finger means are respectively engaged by the first and second contact strips.

The sacrificial grounding means are thus operative to equalize a voltage potential existing between the two circuit boards prior to the attainment of an operative signal interconnection therebetween. This advantageously eliminates the conventional necessity of incorporating clamping type diode structures in either of the circuit boards to protect their ESD-sensitive circuitry from electrostatic discharge damage as they are about to be interconnected.

The sacrificial grounding means are also operative to lessen mechanical wear-away of the signal and grounding finger means by engaging and partially deflecting the opposing pairs of first and second connector contact strips before they are brought into forcible sliding engagement with the signal and grounding finger means during insertion of the connector edge portion into the connector. Because the sacrificial grounding means are engaged by the connector contact strip portion before the signal and grounding finger means are, the sacrificial grounding means bear a substantial portion of the strip wear forces that otherwise would be borne by the signal and grounding finger means.

DETAILED DESCRIPTION

Figure 1:
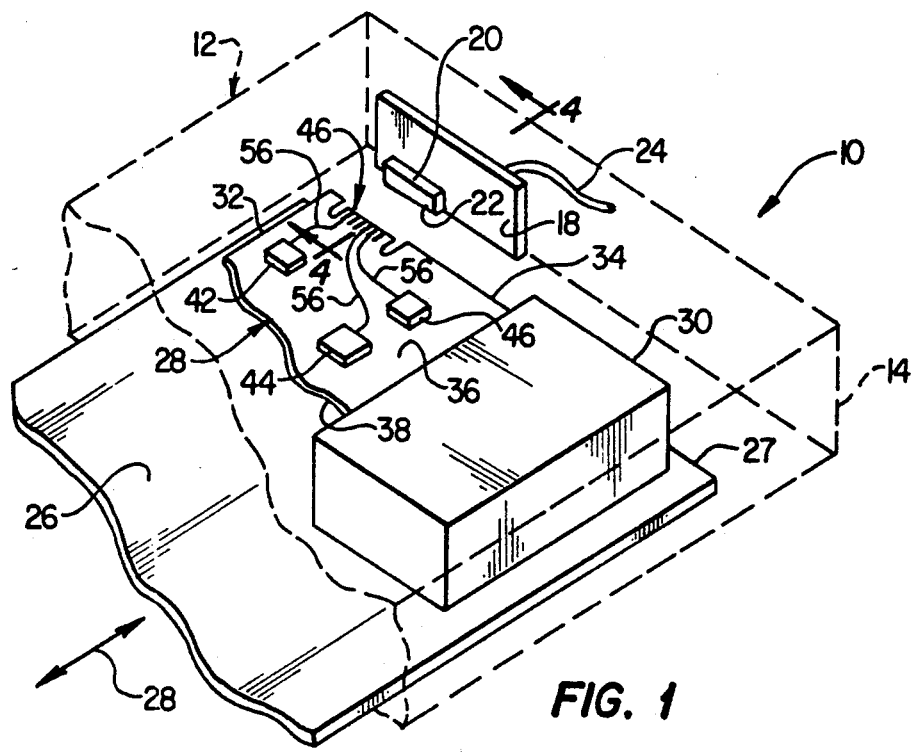
FIG. 1 is a simplified fragmentary perspective view, partially in phantom, of a computer having a main system printed circuit board utilizing specially designed card edge interconnect apparatus embodying principles of the present invention.

Perspectively illustrated in FIG. 1 is a computer 10 embodying principles of the present invention and including a generally rectangular housing 12 having a front end wall 14. Secured to an inside corner portion of the front end wall 14 is a small printed circuit board 18 having a rectangular socketed connector 20, of conventional construction, affixed to its rear side and having a rearwardly facing opening 22. The circuit board 18 is operatively connected to a peripheral portion of the computer, such as its monitor/power supply interface, by appropriate cable means 24.

A generally rectangular support tray structure 26 is forwardly insertable into and rearwardly withdrawable from the interior of the housing 12, as indicated by the double-ended arrow 28 through a suitable opening (not shown) in the rear end wall of the housing 12 Support tray structure 26 has a front end edge 27. The CPU components of the computer, including a main system printed circuit board 28 and a disc drive 30, are suitably mounted on the top side of the support tray structure 26 for selected movement therewith into and out of the interior of the housing 12.

Figure 2:
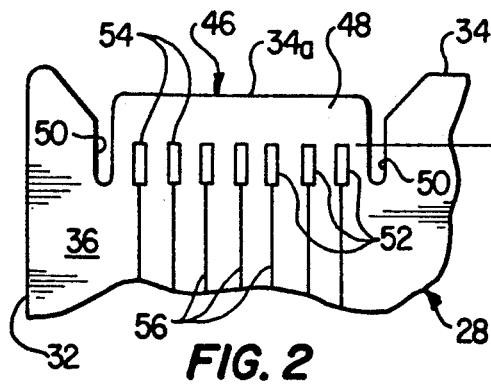
FIGS. 2 and 3, respectively, are enlarged scale top and bottom side elevational views of a card edge connector portion of the printed circuit board.
Figure 3:
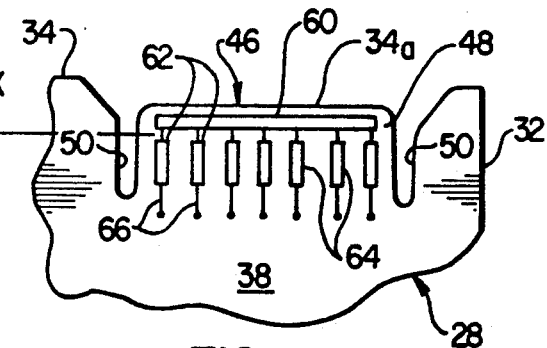

Referring now to FIGS. 1-3, the main system printed circuit board 28 has a left side edge 32; a front end edge 34 projecting slightly forwardly beyond the front end edge 27 of the support tray structure 26; and a generally planar body portion having a top side 36 and a bottom side 38. Operative circuitry components, such as the representatively illustrated chips 42, 44 and 46, are mounted on the top side 36 of the circuit board 28. When the support tray structure 26 is operably inserted forwardly into the computer housing 12, a specially designed card edge connector portion 46 of the main system board 28 forwardly enters the socketed connector 20 to thereby operatively couple the circuitry of the main circuit board 28 to the circuitry of the back plane circuit board 16.

According to a key aspect of the present invention, the insertion of the card edge connector portion 46 into the connector 20 equalizes any voltage potential between the circuit boards 18 and 28 in a manner protecting the ESD-sensitive circuit components thereon from possible damage due to an electrostatic discharge (ESD) between the two circuit boards. Importantly, this ESD protection of the circuitry components on the circuit boards 16 and 28 is achieved without the conventional necessity of protectively interposing a series of clamping diode devices in such circuitry.

Figure 4:
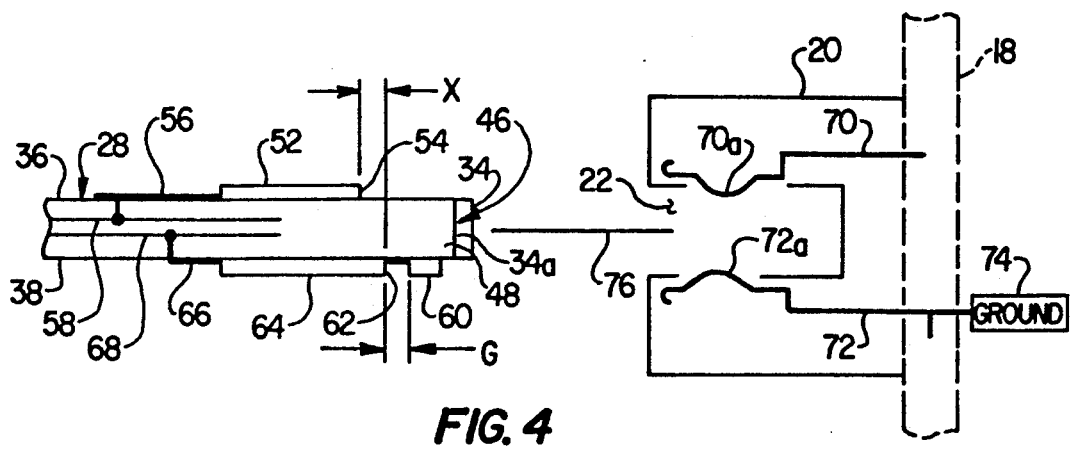
FIG. 4 is an enlarged scale schematic partial cross-sectional view through the computer, taken along line 4—4 of FIG. 1, and illustrating the structure and configuration of the interconnect apparatus.

Turning now to FIGS. 2-4, the card edge connector edge portion 46 of the present invention includes a rearwardly inset leading edge portion 48 of the circuit board 28 which is disposed adjacent the left side edge 32 of the circuit board 28. Leading edge portion 48 has a front edge 34a rearwardly offset from the board edge 34, and is bounded on its opposite sides by a pair of slots 50 extended inwardly through the front end edge 34.

A spaced series of electrically conductive signal finger pads 52 are formed on the top side of the leading edge portion 48. The signal finger pads 52 have rectangular configurations, are elongated in a direction transverse to the front edge portion 34a, and have aligned front ends 54 inwardly offset from the front edge portion 34a. Electrically conductive surface traces 56, which are considerably thinner than the signal fingers 52, extend along the top side 36 of the main system printed circuit board 28 and are appropriately connected to the signal plane 58 of the circuit board 28 and the circuitry of the board (such as the chips 42, 44 and 46 illustrated in FIG. 1).

Formed on the bottom side 38 of the leading edge portion 48 is an electrically conductive sacrificial grounding pad 60. Pad 60 has an elongated rectangular configuration, longitudinally extends parallel to the front edge portion 34a, and is laterally inset a small distance from the edge portion 34a. A gap G separates the rear side of the grounding pad 60 from the aligned front ends 64 of a spaced series of electrically conductive grounding finger pads 64 formed on the bottom side 38 of the leading edge portion 48. The spaced grounding fingers 64 have elongated rectangular configurations, and longitudinally extend perpendicularly to the length of the grounding pad 60.

Electrically conductive surface traces 66 extend across the bottom side 38 of the circuit board 28, electrically connect the grounding pad 60 to the grounding fingers 64, and are connected to the ground plane portion 68 of the circuit board. As illustrated, the ground pad 60 is spaced forwardly apart from the front ends 62 of the grounding fingers 64 by the gap distance G, and the front ends 62 of the grounding fingers 64 are forwardly offset from the front ends 54 of the signal fingers 52 by a small distance X.

As previously mentioned, the socketed connector 20 is of a conventional construction. Disposed within the interior of the connector 20 (see FIG. 4) are horizontally spaced pairs of vertically opposed upper and lower resilient, vertically deflectable metal electrical contact strips 70,72 respectively having inwardly bent contact portions 70a,72a adjacent the connector opening 22 Contact strips 72, as indicated, are connected to ground 74. Strips 70,72 are horizontally spaced in a manner such that when the leading edge portion 48 of the main system printed circuit board 28 is fully inserted into the connector 20, as indicated by the arrow 76 in FIG. 4, the upper strips 70 will contact and be upwardly deflected by the signal fingers 52, and the lower strips 72 will contact and be downwardly deflected by the grounding fingers 64.

As the leading edge portion 48 of the circuit board 28 forwardly passes through the connector opening 22, the sacrificial grounding pad 60 engages and downwardly deflects the lower contact strip portions 72a prior to engagement of the signal fingers 52 by the contact strip portions 70a. This initial engagement of the grounding pad 60 by the lower contact strip portions 72a instantly equalizes any voltage potential existing between the circuit boards 28 and 18 by electrically coupling the ground plane 68 with the ground 74. As previously mentioned, this protects the board circuitry against possible electrostatic discharge damage without the conventional necessity of installing clamping diode devices on the main system circuit board or on the back plane circuit board.

This unique ability of the card edge interconnect apparatus of the present invention to protect the board circuitry from electrostatic discharge damage upon interconnection of the two circuit boards substantially reduces the fabrication cost of the boards, since protective diode structures do not have to be installed on the boards. The elimination of the need for such protective diode devices also frees the otherwise diode-occupied board space for additional operative circuitry thereon.

As the leading board edge portion 48 is moved further into the interior of the connector 20, the lower contact strip portions 72a are brought into engagement with the grounding fingers 64. Finally, further movement of the edge portion 48 into the interior of the connector 20 brings the upper contact strip portions 70a into engagement with the signal fingers 52, thereby operatively coupling the circuitry on the circuit boards 18 and 28.

The sacrificial grounding pad 60 serves two advantageous purposes in the card edge interconnect apparatus just described First, as discussed above, it serves to create an initial ESD-protective engagement between the circuit boards 18 and 28 prior to the operative coupling of the main system circuit board 28 to the back plane structure 16 via the signal fingers 52.

Second, it substantially lengthens the useful connectivity life of the main system printed circuit board 28 by sacrificially reducing the mechanical wear-away action imposed on the signal and grounding fingers 54,62 by the metal contact strip portions 70a,72a. The mechanics of this wear-away protection may be seen from FIG. 4.

Specifically, as the leading circuit board edge portion 48 initially enters the connector opening 20, the contact strip portions 70a,72a will engage and be vertically deflected, through a portion of their final deflection distance, by the top side 36 of the leading edge portion 48 and the grounding pad 60 prior to the strip portions 70a,72a being fully deflected by their subsequent forcible engagement with the fingers 52,64. Accordingly, when the strip portions 70a,72a do come into contact with the fingers 52,64 they are already partially deflected and do not tend to wear away the fingers as rapidly as they would in the absence of the sacrificial grounding pad 60 which absorbs a substantial portion of the wear-away forces of the strip portions 70a,72a.

Stated otherwise, the pad 60 substantially delays the eventual wearing away of the fingers 52,64 by the strip portions 70a,72a and thus desirably prolongs the connectivity life of the main system printed circuit board 28. This feature is particularly advantageous in the illustrated embodiment of the invention since, due to the ease in removing the circuit board 28 from the computer housing 12, the likelihood that the board will be connected to and removed from the connector 20 many times during the life of the computer is substantially increased.

It should be noted that even after horizontally spaced sections of the sacrificial grounding pad 60 are worn away by the strip portions 72a to an extent that the leading ends of the signal and grounding fingers 52,64 must fully deflect the contact strips, the ESD protection aspect of the interconnection apparatus remains intact This is due to the fact that, as mentioned above, the leading ends 62 of the grounding fingers 64 are forwardly offset by the indicated distance X from the leading ends 54 of the signal fingers 52. Because of this, a voltage potential equalizing contact is still made between the boards 18 and 28 prior to an operative signal contact therebetween.

The foregoing detailed description is to be clearly understood as being given by way of illustration and example only, the spirit and scope of the present invention being limited solely by the appended claims.

What is claimed is:

1. A printed circuit board comprising:
   a generally planar body portion having first and second opposite sides and a card edge connector portion insertable in an insertion direction into a socketed connector having opposed pairs of first and second resiliently deflectable, electrically conductive contact strips therein, said card edge connector portion having a leading edge extending transversely to said insertion direction;
   a ground plane structure;
   a signal plane structure;
   electrical circuitry components disposed on said first side of said body portion and operatively connected to said signal plane structure; and
   coupling means, responsive to insertion of said card edge connector portion into the socketed connector, for electrically coupling said circuitry components to said first and second contact strips in a manner protecting said circuitry components from coupling related electrostatic discharge damage, said coupling means including:
   a spaced plurality of electrically conductive signal fingers disposed on said first side of said card edge connector portion and having leading ends facing and inwardly offset from said leading edge of said card edge connector portion, said signal fingers being electrically connected to said signal plane structure and engageable by the first contact strips when said card edge connector portion is inserted into the connector,
   a spaced plurality of electrically conductive grounding fingers disposed on said second side of said card edge connector portion and having leading ends facing and inwardly offset from said leading edge of said card edge connector portion, said grounding fingers being electrically connected to said grounding plane structure and engageable by the second contact strips when said card edge connector portion is inserted into the connector, and
   an elongated electrically conductive grounding pad member disposed on said second side of said card edge connector portion, said grounding pad member being longitudinally parallel to said leading edge, offset from said leading ends of said signal and grounding fingers toward said leading edge, engageable by the second contact strips as said card edge connector portion is being inserted into the connector, and electrically connected to said grounding plane structure.

2. The printed circuit board apparatus of claim 1 wherein:

said leading ends of said grounding fingers are offset toward said leading edge of said card edge connector portion relative to said leading ends of said signal fingers.

3. The printed circuit board apparatus of claim 2 wherein:
said printed circuit board apparatus is a computer main system printed circuit board.

4. Printed circuit board apparatus comprising:
a first printed circuit board;
a second printed circuit board having a ground plane structure; and
coupling means for operatively interconnecting the circuitry on said first and second printed circuit boards, said coupling means including:
a socketed connector secured to said first printed circuit board and operatively coupled to its circuitry, said connector having interiorly disposed therein spaced apart opposed pairs of first and second resiliently deflectable electrically conductive contact strips,
a connector edge portion of said second printed circuit board configured to be removably inserted into said connector, said connector edge portion having a leading edge and first and second opposite sides,
a spaced series of electrically conductive signal finger means disposed on said first side of said connector edge portion and coupled to the circuitry of said first printed circuit board, said signal finger means being spaced inwardly apart from said leading edge and positioned to be resiliently engaged by said first contact strips when said connector edge portion is inserted into said connector,
a spaced series of electrically conductive grounding finger means disposed on said second side of said connector edge portion and coupled to said ground plane structure, said grounding finger means being spaced inwardly apart from said leading edge and positioned to be resiliently engaged by said second contact strips when said connector edge portion is inserted into said connector, and
electrically conductive sacrificial grounding means disposed on said second side of said connector portion and coupled to said ground plane structure, said sacrificial grounding means being positioned to be resiliently engaged by said second contact strips, as said connector edge portion is being inserted into said connector, before said signal and grounding finger means are respectively engaged by said first and second contact strips, to thereby equalize a voltage potential existing between said first and second circuit boards, said sacrificial grounding means being further operative to lessen mechanical wear-away of said grounding finger means by said second contact strips.

5. The printed circuit board apparatus of claim 4 wherein:
said signal finger means are spaced inwardly apart from said leading edge a distance further than the distance said grounding finger means are spaced inwardly apart from said leading edge.

6. The printed circuit board apparatus of claim 4 wherein
said grounding finger means are defined by a laterally spaced, parallel series of elongated rectangular members having front ends facing and inwardly spaced apart from said leading edge, and
said sacrificial grounding means include an elongated rectangular grounding member longitudinally extending parallel to said leading edge and laterally spaced forwardly apart from said front ends.

7. The printed circuit board apparatus of claim 4 wherein:
said first printed circuit board is a computer main system board, and
said connector is disposed on a side surface portion of said second printed circuit board.

8. Computer apparatus comprising:
a housing having an exterior wall;
a first printed circuit board interiorly mounted on said exterior housing wall and having a side surface facing away from said exterior housing wall;
a socketed connector mounted on said side surface of said first printed circuit board and operatively coupled to its circuitry, said connector having disposed therein a spaced series of opposing first and second electrically conductive resilient contact strip members;
a support structure removably insertable into said housing toward said exterior housing wall, said support structure having mounted thereon a plurality of CPU components of said computer apparatus, including a main system printed circuit board having a ground plane structure; and
coupling means, associated with said main system printed circuit board, for operatively and removably coupling the circuitry of said first and main system printed circuit boards in response to the insertion of said support structure into said housing toward said exterior wall thereof, said coupling means including:
a connector edge portion of said main system printed circuit board positioned and configured to be removably inserted into said connector as said support structure approaches said first printed circuit board, said connector edge portion having a leading edge and first and second opposite sides,
a spaced series of electrically conductive signal finger means disposed in said first side of said connector edge portion and coupled to the circuitry of said main system printed circuit board, said signal finger means being spaced inwardly apart from said leading edge and positioned to be resiliently engaged by said first contact strips when said connector edge portion is inserted into said connector,
a spaced series of electrically conductive grounding finger means disposed on said second side of said connector edge portion and coupled to said ground plane structure, said grounding finger means being spaced inwardly apart from said leading and positioned to be resiliently engaged by said second contact strips when said connector edge portion is inserted into said connector, and
electrically conductive sacrificial grounding means disposed on said second side of said connector portion and coupled to said ground plane structure, said sacrificial grounding means being positioned to be resiliently engaged by said second contact strips, as said connector edge portion is being inserted into said connector, before said signal and grounding finger means are respectively engaged by said first and second contact strips, to thereby equalize a voltage potential existing between said first and main system printed circuit boards, said sacrificial grounding means being further operative to lessen mechanical wear-away of said grounding finger means by said second contact strips.

9. The computer apparatus of claim 8 wherein:
said signal finger means are spaced inwardly apart from said leading edge a distance further than the distance said grounding finger means are spaced inwardly apart from said leading edge.

10. The computer apparatus of claim 8 wherein
said grounding finger means are defined by a laterally spaced, parallel series of elongated rectangular members having front ends facing and inwardly spaced apart from said leading edge, and
said sacrificial grounding means include an elongated rectangular grounding member longitudinally extending parallel to said leading edge and laterally spaced forwardly apart from said front ends.

* * * * *